(12) United States Patent
Maeda et al.

(10) Patent No.: US 8,707,554 B2
(45) Date of Patent: Apr. 29, 2014

(54) METHOD OF MANUFACTURING MULTILAYER WIRING SUBSTRATE

(75) Inventors: Shinnosuke Maeda, Nagoya (JP); Tetsuo Suzuki, Niwa-gun (JP); Takuya Hando, Inuyama (JP); Tatsuya Ito, Kakamiganhara (JP); Satoshi Hirano, Chita-gun (JP); Atsuhiko Sugimoto, Kagamigahara (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 166 days.

(21) Appl. No.: 12/979,474

(22) Filed: Dec. 28, 2010

(65) Prior Publication Data

US 2011/0155443 A1 Jun. 30, 2011

(30) Foreign Application Priority Data

Dec. 28, 2009 (JP) ................. 2009-296911

(51) Int. Cl.
*H01R 9/00* (2006.01)
*H05K 3/00* (2006.01)

(52) U.S. Cl.
USPC ............ 29/842; 29/825; 29/830; 29/831; 29/846

(58) Field of Classification Search
USPC .......... 29/842, 825, 830–832, 840, 846, 847; 174/255, 258, 259, 262, 267
See application file for complete search history.

(56) References Cited

U.S. PATENT DOCUMENTS

| 7,060,604 | B2 | 6/2006 | Kata et al. |
| 7,152,314 | B2 | 12/2006 | Shuto et al. |
| 7,222,421 | B2 * | 5/2007 | Nakamura ............... 29/830 |
| 7,233,066 | B2 | 6/2007 | Kata et al. |
| 8,176,627 | B2 | 5/2012 | Kobayashi |
| 2004/0053489 | A1 | 3/2004 | Kata et al. |
| 2004/0211751 | A1 | 10/2004 | Shuto et al. |
| 2006/0102383 | A1 | 5/2006 | Cha et al. |
| 2006/0189125 | A1 | 8/2006 | Kata et al. |
| 2007/0124924 | A1 | 6/2007 | Nakamura |
| 2008/0202661 | A1 | 8/2008 | Kobayashi |
| 2008/0308308 | A1 | 12/2008 | Kobayashi |

FOREIGN PATENT DOCUMENTS

| JP | 2008-251702 A | 10/2001 |
| JP | 2002-151618 A | 5/2002 |
| JP | 2004-111536 A | 4/2004 |
| JP | 2004-111544 A | 4/2004 |

(Continued)

OTHER PUBLICATIONS

Office Action mailed Sep. 4, 2012 in corresponding Korean Patent Application No. 10-2010-135649.
JPO, Office Action issued in corresponding application 2009-296911, issued Mar. 19, 2013.

(Continued)

*Primary Examiner* — Thiem Phan
(74) *Attorney, Agent, or Firm* — Stites & Harbison PLLC; Jeffrey A. Haeberlin; Nicolo Davidson

(57) ABSTRACT

In a build-up step, a plurality of resin insulation layers and a plurality of conductive layers are alternately laminated in multilayer arrangement on a metal foil separably laminated on a side of a base material, thereby forming a wiring laminate portion. In a drilling step, a plurality of openings are formed in an outermost resin insulation layer through laser drilling so as to expose connection terminals. Subsequently, in a desmear step, smears from inside the openings are removed. In a base-material removing step performed after the build-up step, the base material is removed and the metal foil is exposed.

6 Claims, 8 Drawing Sheets

(56) References Cited

FOREIGN PATENT DOCUMENTS

| | | |
|---|---|---|
| JP | 2004-235323 A | 8/2004 |
| JP | 2006-24699 A | 1/2006 |
| JP | 2006-196768 A | 7/2006 |
| JP | 2007-158174 A | 6/2007 |
| KR | 10-2006-0054578 A1 | 5/2006 |
| TW | I228957 B | 3/2005 |
| TW | 200845340 A | 11/2008 |

OTHER PUBLICATIONS

KIPO, Office Action issued in corresponding application 10-2010-135649, issued Feb. 13, 2013.

Taiwan Patent Office, Notification for the Opinion of Examination issued in corresponding Taiwanese Application Serial No. 099145997, mailing date Aug. 9, 2013.

JPO, Office Action issued in corresponding application 2009-296911, dispatched Nov. 19, 2013.

* cited by examiner

METHOD OF MANUFACTURING MULTILAYER WIRING SUBSTRATE

CROSS REFERENCE TO RELATED APPLICATIONS

The present application claims priority from Japanese Patent Application No. 2009-296911, which was filed on Dec. 28, 2009, the disclosure of which is herein incorporated by reference in its entirety.

TECHNICAL FIELD

The present invention relates to a method of manufacturing a multilayer wiring substrate having a laminate structure in which a plurality of resin insulation layers made primarily of the same resin insulation material, and a plurality of conductive layers are laminated alternately in multilayer arrangement, and not having a so-called substrate core. The present invention also relates to a multilayer wiring substrate manufactured by use of such a method.

BACKGROUND ART

In association with recent increasing tendency toward higher operation speed and higher functionality of semiconductor integrated circuit devices (IC chips) used as, for example, microprocessors of computers, the number of terminals increases, and the pitch between the terminals tends to become narrower. Generally, a large number of terminals are densely arrayed on the bottom surface of an IC chip and flip-chip-bonded to terminals provided on a motherboard. However, since the terminals of the IC chip differ greatly in pitch from those of the motherboard, difficulty is encountered in bonding the IC chip directly onto the motherboard. Thus, according to an ordinarily employed method, a semiconductor package configured such that the IC chip is mounted on an IC chip mounting wiring substrate is fabricated, and the semiconductor package is mounted on the motherboard.

The IC chip mounting wiring substrate which partially constitutes such a semiconductor package is practicalized in the form of a multilayer substrate configured such that a build-up layer is formed on the front and back surfaces of a substrate core. The substrate core used in the multilayer wiring substrate is, for example, a resin substrate (glass epoxy substrate) formed by impregnating reinforcement fiber with resin. Through utilization of rigidity of the substrate core, resin insulation layers and conductive layers are laminated alternately on the front and back surfaces of the substrate core, thereby forming respective build-up layers. In the multilayer wiring substrate, the substrate core serves as a reinforcement and is formed very thick as compared with the build-up layers. Also, the substrate core has conductor lines (specifically, through-hole conductors, etc.) extending therethrough for electrical communication between the build-up layers formed on the front and back surfaces.

In recent years, in association with implementation of high operation speeds of semiconductor integrated circuit devices, signal frequencies to be used have become those of a high frequency band. In this case, the conductor lines which extend through the substrate core serve as sources of high inductance, leading to the transmission loss of high-frequency signals and the occurrence of circuitry malfunction and thus hindering implementation of high operation speed. In order to solve this problem, a multilayer wiring substrate having no substrate core is proposed (refer to, for example, Patent Documents 1 and 2). The multilayer wiring substrates described in Patent Documents 1 and 2 do not use a substrate core, which is relatively thick, thereby reducing the overall wiring length. Thus, the transmission loss of high-frequency signals is lowered, whereby a semiconductor integrated circuit device can be operated at high speed.

In the manufacturing method disclosed in Patent Document 1, a metal foil is disposed one side of a provisional substrate, and a plurality of conductive layers and a plurality of resin insulation layers are alternately stacked on the metal foil to thereby form a build-up layer. Subsequently, the metal foil is separated from the provisional substrate so as to obtain a structure in which the build-up layer is formed on the metal foil. The surface of the outermost layer (the surface of a resin insulation layer and the surfaces of a plurality of IC-chip connection terminals) is exposed by means of removing the metal foil through etching, whereby a multilayer wiring substrate is manufactured.

Patent Document 1 also discloses a multilayer wiring substrate in which a solder resist film is formed on the build-up layer as the outermost layer thereof. Notably, openings are formed in the solder resist film so as to expose the surfaces of IC-chip connection terminals. In a multilayer wiring substrate disclosed in Patent Document 2 as well, a solder resist film is formed, as the outer most layer, on the side of the wiring substrate where an IC chip is mounted, and openings are formed in the solder resist film so as to expose the top surfaces of IC-chip connection terminals. The solder resist film is made primarily of a hardened photocurable resin insulation material. The openings of the solder resist film are formed through exposure and development performed in a state in which a predetermined mask is disposed on the solder resist film. Subsequently, solder bumps are formed on the top surfaces of the IC-chip connection terminals exposed within the openings of the solder resist film, and an IC chip is mounted via the solder bumps.

Furthermore, there has been proposed a multilayer wiring substrate for mounting an IC chip in which the space between an IC chip connected to the IC-chip connection terminals and the surface of the substrate is sealed by use of an underfill agent.

Patent Document 1: Japanese Patent Application Laid-open (kokai) No. 2007-158174
Patent Document 2: Japanese Patent Application Laid-open (kokai) No. 2004-111544

BRIEF SUMMARY OF THE INVENTION

Incidentally, in the above-described multilayer wiring substrate for mounting an IC chip, a hydrophobic material is used as an underfill agent for sealing the IC chip. Meanwhile, when solder bumps are formed on the IC-chip connection terminals, a hydrophilic flux is used. That is, there is a demand for enabling the hydrophilic flux, as well as the hydrophobic underfill agent, to wet and spread on the surface of the multilayer wiring substrate in a proper condition. However, difficulty has been encountered in setting the degree of surface roughness of the multilayer wiring substrate to a proper level. Specifically, in the case of the multilayer wiring substrate disclosed in Patent Document 1, a copper foil is removed through etching, whereby the outermost resin insulation layer and the IC-chip connection terminals are exposed. However, the etching process roughens the surface of the resin insulation layer to some degree. If the degree of surface roughness of the resin insulation layer becomes excessively high, the flowability of the underfill agent deteriorates, and voids or the like may be formed. On the other hand, if the degree of surface roughness of the solder resist film is small, the flux spreads excessively due to its wettability, whereby reliable formation of solder bumps becomes difficult.

Furthermore, the above-described multilayer wiring substrate has the following drawback. When a solder resist film is formed as the outermost layer, due to a difference in coefficient of thermal expansion between the solder resist film and inner resin insulation layers, the substrate warps in accordance with the difference in coefficient of thermal expansion. In this case, since a structure (e.g., a reinforcing plate or the like) is additionally required so as to restrain the warpage, the manufacturing cost of the multilayer wiring substrate increases. Moreover, the solder resist film is inferior in electrical insulation performance to the inner resin insulation layers. Therefore, if the inter-terminal spacing of the IC-chip connection terminals is decreased, the insulation provided by the solder resist film becomes insufficient, and a short circuit may be formed between the terminals.

The present invention has been conceived in view of the above problems, and an object of the invention is to provide a method of manufacturing a multilayer wiring substrate which can set the degree of surface roughness of the outermost layer to a proper level. Another object of the present invention is to provide a multilayer wiring substrate in which the degree of surface roughness of the outermost layer is set to a proper level, to thereby enable an IC chip to be mounted thereon reliably.

A means (first means) for solving the above problems is a method of manufacturing a multilayer wiring substrate having a laminate structure in which a plurality of resin insulation layers made primarily of the same resin insulation material, and a plurality of conductive layers are laminated alternately in multilayer arrangement, a plurality of first-main-surface-side connection terminals being disposed on one side of the laminate structure where a first main surface thereof is present, a plurality of second-main-surface-side connection terminals being disposed on an other side of the laminate structure where a second main surface thereof is present, the plurality of conductive layers being formed in the plurality of resin insulation layers and interconnected by means of via conductors whose diameters increase toward the first main surface or the second main surface. The method comprises a build-up step of alternately laminating the plurality of resin insulation layers and the plurality of conductive layers in multilayer arrangement on a side of a base material where a metal foil is separably laminated (i.e., alternately laminating the plurality of resin insulation layers and the plurality of conductive layers in multilayer arrangement on a metal foil separably laminated on a side of a base material), thereby forming the laminate structure; a drilling step of forming a plurality of openings in an outermost resin insulation layer through laser drilling so as to expose the first-main-surface-side connection terminals; a desmear step of, after the drilling step, removing smears from inside the openings; and a base-material removing step of, after the build-up step, removing the base material and exposing the metal foil.

According to the invention described in the first means, the outermost resin insulation layer is formed of the same resin insulation material as the inner resin insulation layers of the laminate structure. Therefore, as compared with the case where the outermost resin insulation layer is formed of a different resin insulation material, the influence of a difference in coefficient of thermal expansion in the laminate structure can be mitigated. As a result, warpage of the multilayer wiring substrate can be suppressed. Since the outermost resin insulation layer is formed of the same resin insulation material as the inner resin insulation layers, it is difficult to form openings by a lithography process. However, openings can be reliably formed in the outermost resin insulation layer through performance of laser drilling. Furthermore, the desmear step is performed after the build-up step, the degree of surface roughness of the outermost resin insulation layer can be set to an arbitrary level. Accordingly, the surface of the outermost resin insulation layer, which constitutes the multilayer wiring substrate, can have a surface roughness suitable to flux and underfill agent, whereby they can be spread in a proper state by their wettability.

Preferably, the outermost resin insulation layer is formed of a build-up material mainly formed of a hardened resin insulation material that is not photocurable. The build-up material can be selected as appropriate in consideration of electrical insulation performance, heat resistance, humidity resistance, etc. Preferred examples of the build-up material include thermosetting resins, such as epoxy resin, phenol resin, urethane resin, silicone resin, and polyimide resin; and thermoplastic resins, such as polycarbonate resin, acrylic resin, polyacetal resin, and polypropylene resin. Additionally, there may be used a composite material consisting of any one of these resins, and glass fiber (glass woven fabric or glass nonwoven fabric) or organic fiber, such as polyamide fiber, or a resin-resin composite material in which a three-dimensional network fluorine-containing resin base material, such as continuously porous PTFE, is impregnated with a thermosetting resin, such as epoxy resin.

The conductive layers are made primarily of copper and are formed by a known process, such as a subtractive process, a semi-additive process, or a fully-additive process. Specifically, for example, etching of a copper foil, electroless copper plating, or copper electroplating is applied. Also, the conductive layers and the connection terminals can be formed by forming a thin film by sputtering, CVD, or a like process, followed by etching. Alternatively, the conductive layers and the connection terminals can be formed through application of conductive paste or the like by printing.

There may be successively performed a connection-terminal forming step of, after the base-material removing step, forming the second-main-surface-side connection terminals in a state in which etching resist films cover an entirety of the first main surface and the metal foil in a predetermined pattern corresponding to the second-main-surface-side connection terminals, and subsequently etching the metal foil to form the second-main-surface-side connection terminals; and a resist removing step of removing the etching resist films to thereby expose the first-main-surface-side connection terminals and the second-main-surface-side connection terminals. In this method, the step of forming openings through laser drilling is performed before performance of the base-material removing step. In this case, since the laminate structure on the base material has a relatively large strength, it can be maintained in a warpage-free state, whereby openings can be formed on the surface of the laminate structure at accurate positions.

There may be performed a connection-terminal forming step of, after the base-material removing step, forming the second-main-surface-side connection terminals by patterning the metal foil by a subtractive method in a state in which an etching resist film is provided on the second main surface; wherein the drilling step is performed after the connection-terminal forming step. In this case, in the connection-terminal forming step, the outermost layer on the first main surface side is covered with the resin insulation layer; and no opening is provided in the resin insulation layer. Accordingly, the outermost resin insulation layer can be caused to function as an etching resist film. Therefore, separate formation of an etching resist film on the first main surface side becomes unnecessary, and the second-main-face-side connection terminals can be formed in a state in which an etching resist film is provided on the second main surface only.

The drilling step my be performed such that the first-main-surface-side connection terminals are exposed, and a portion of one of the plurality of conductive layers other than the first-main-surface-side connection terminals is exposed. Specifically, for example, a portion of a conductive layer which will become an alignment mark may be exposed, whereby positioning of the wiring substrate is facilitated.

Another means (second means) for solving the above problems is a multilayer wiring substrate having a laminate structure in which a plurality of resin insulation layers made primarily of the same resin insulation material, and a plurality of conductive layers are laminated alternately in multilayer arrangement, a plurality of first-main-surface-side connection terminals being disposed on one side of the laminate structure where a first main surface thereof is present, a plurality of second-main-surface-side connection terminals being disposed on an other side of the laminate structure where a second main surface thereof is present, the plurality of conductive layers being formed in the plurality of resin insulation layers and interconnected by means of via conductors whose diameters increase toward the first main surface or the second main surface. The plurality of resin insulation layers are formed of a build-up material mainly formed of a hardened resin insulation material that is not photocurable; a plurality of openings are formed in an outermost resin insulation layer exposed on the side where the first main surface of the laminate structure is present (i.e., exposed as the first main surface); at least two types of connection terminals, including IC-chip connection terminals to which an IC chip is to be connected, and passive-component connection terminals to which a passive component connection is to be connected and which are larger in area (i.e., have a larger exposed surface area) than the IC-chip connection terminals, are present on the first main surface as the first-main-surface-side connection terminals; and the IC-chip connection terminals are disposed in the plurality of openings, top surfaces of the IC-chip connection terminals are lower in height than (i.e., recessed from) an outer surface of the outermost resin insulation layer, and peripheral portions of the IC-chip connection terminals are buried in the outermost resin insulation layer.

According to the invention described in the second means, the multilayer wiring substrate is formed such that a plurality of resin insulation layers made primarily of the same resin insulation material, and a plurality of conductive layers are laminated alternately, and assumes the form of a coreless wiring substrate having no substrate core. In this multilayer wiring substrate, the outermost resin insulation layer is formed of a resin insulation material which is the same as that used for forming the inner resin insulation layers and which is not photocurable, as compared with the case where the outermost resin insulation layer is formed of a different resin insulation material, the influence of a difference in coefficient of thermal expansion can be mitigated. As a result, warpage of the multilayer wiring substrate can be suppressed. Furthermore, two types of connection terminals, including IC-chip connection terminals to which an IC chip is to be connected, and passive-component connection terminals to which a passive component connection is to be connected and which is larger in area than the IC-chip connection terminals, are present on the first main surface as the first-main-surface-side connection terminals; and the IC-chip connection terminals are disposed in the plurality of openings. The top surfaces of the IC-chip connection terminals are lower in height than the surface of the outermost resin insulation layer, and peripheral portions of the IC-chip connection terminals are buried in the outermost resin insulation layer. Accordingly, the outermost resin insulation layer functions as a solder resist film, whereby solder bumps can be reliably formed on the top surfaces of the IC-chip connection terminals. Moreover, since the outermost resin insulation layer is formed of a build-up material which is the same as that used to form the inner resin insulation layers and which is excellent in electrical insulation performance, the intervals of the IC-chip connection terminals can be narrowed, whereby the degree of integration of the multilayer wiring substrate can be increased.

Preferably, each of the passive-component connection terminals has a structure in which a plating layer of a material other than copper covers a top surface and a side surface of a portion of a copper layer which portion is a main constituent of the passive-component connection terminal, and each of the IC-chip connection terminals has a structure in which a plating layer of a material other than copper covers only a top surface a portion of the copper layer which portion is a main constituent of the IC-chip connection terminal. This configuration enables reliable formation of relatively large filets on the top and side surfaces of the passive-component connection terminals. Also, solder bumps can be reliably formed on the top surfaces of the IC-chip connection terminals. The inter-terminal spacing of the passive-component connection terminals is greater than that of the IC-chip connection terminals, and the passive-component connection terminals have a relatively large size. Therefore, passive components can be reliably solder-connected to the passive-component connection terminals with a sufficiently large strength via filets formed on the top and side surfaces of the passive-component connection terminals. Meanwhile, since the inter-terminal spacing of the IC-chip connection terminals is small, if solder bumps bulge from the side surfaces of the IC-chip connection terminals, a short-circuit may be formed between the terminals. In contrast, in the present invention, since solder bumps are formed only on the top surfaces of the IC-chip connection terminals, solder bumps do not bulge laterally, whereby formation of a short-circuit between the terminals can be avoided.

DETAILED DESCRIPTION OF EXEMPLARY EMBODIMENTS OF THE INVENTION

First Embodiment

Figure 1:
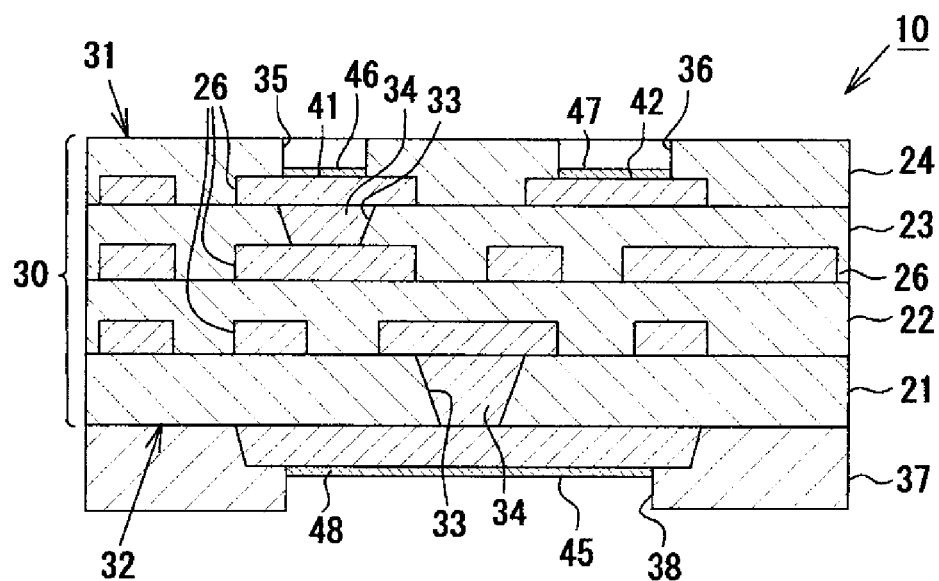
FIG. 1 Sectional view schematically showing the structure of a multilayer wiring substrate according to a first embodiment.
Figure 2:
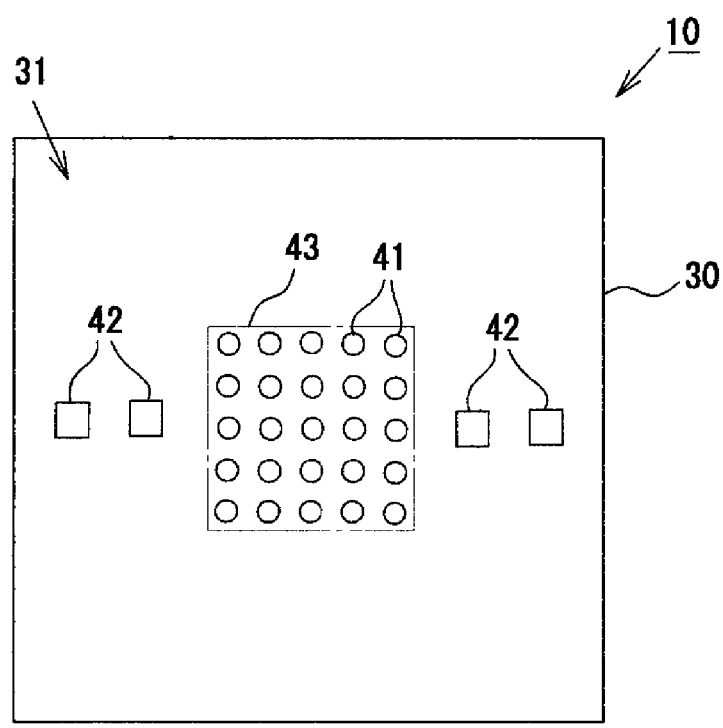
FIG. 2 Plan view schematically showing the structure of the multilayer wiring substrate according to the first embodiment.

A multilayer wiring substrate according to a first embodiment of the present invention will next be described in detail with reference to the drawings. FIG. 1 is an enlarged sectional view schematically showing the structure of the multilayer wiring substrate of the present embodiment. FIG. 2 is a plan view of the multilayer wiring substrate.

As shown in FIG. 1, a multilayer wiring substrate 10 is a coreless wiring substrate having no substrate core and has a multilayer wiring laminate portion 30 (laminate structure) in which four resin insulation layers 21, 22, 23, and 24 made primarily of the same resin insulation material, and conductive layers 26 made of copper are laminated alternately. The resin insulation layers 21 to 24 are formed of a build-up material made primarily of a hardened resin insulation material that is not photocurable; specifically, a hardened thermosetting epoxy resin. In the multilayer wiring substrate 10, a plurality of connection terminals 41 and 42 (first-main-surface-side connection terminals) are disposed on one side (first main surface side) of the wiring laminate portion 30 where a top surface 31 thereof is present.

As shown in FIGS. 1 and 2, in the multilayer wiring substrate 10 of the present embodiment, a plurality of the connection terminals 41 and 42 disposed on the top surface 31 side of the wiring laminate portion 30 are IC-chip connection terminals 41 to which an IC chip is to be connected, and capacitor connection terminals 42 (passive-component connection terminals) to which chip capacitors (passive components) are to be connected. On the top surface 31 side of the wiring laminate portion 30, a plurality of the IC-chip connection terminals 41 are arrayed in a chip mounting region 43 provided at a central portion of the multilayer wiring substrate 10. The capacitor connection terminals 42 are greater in area than the IC-chip connection terminals 41 and are disposed externally of the chip mounting region 43.

Meanwhile, on the other side (second main surface side) of the wiring laminate portion 30 where a bottom surface 32 thereof is present, a plurality of connection terminals 45 (motherboard connection terminals serving as second-main-surface-side connection terminals) for LGA (land grid array) to which a motherboard is to be connected are arrayed. The motherboard connection terminals 45 are greater in area than the IC-chip connection terminals 41 and the capacitor connection terminals 42 on the top surface 31 side.

Via holes 33 and filled-via conductors 34 are provided in the resin insulation layers 21, 22, 23, and 24. The via conductors 34 are shaped such that their diameters increase in the same direction (in FIG. 1, in the direction from the bottom surface toward the top surface). The via conductors 34 electrically interconnect the conductive layers 26, the IC-chip connection terminals 41, the capacitor connection terminals 42, and the motherboard connection terminals 45.

On the top surface 31 side of the wiring laminate portion 30, a plurality of openings 35 and 36 are formed in the fourth resin insulation layer 24 serving as an outermost layer and exposed to the outside. The IC-chip connection terminals 41 are formed in the openings 35 such that their top surfaces are lower in height than the surface (reference surface) of the resin insulation layer 24. Peripheral portions of the IC-chip connection terminals 41 are buried in the resin insulation layer 24. Furthermore, the capacitor connection terminals 42 are formed in the openings 36 such that their top surfaces are lower in height than the surface of the resin insulation layer 24. Peripheral portions of the capacitor connection terminals 42 are buried in the resin insulation layer 24. The IC-chip connection terminals 41 and the capacitor connection terminals 42 are mainly formed by a copper layer. Each of the IC-chip connection terminals 41 and the capacitor connection terminals 42 has a structure in which a plating layer 46 or 47 of a material other than copper (specifically, a nickel-gold plating layer) covers only the top surface of a portion of the copper layer which portion is the main constituent of the IC-chip connection terminal 41 or the capacitor connection terminal 42.

On the bottom surface 32 side of the wiring laminate portion 30, the substantially entirety of the surface of the resin insulation layer 21 is covered with a solder resist film 37. Openings 38 are formed in the solder resist film 37 so as to expose the motherboard connection terminals 45. In the present embodiment, the openings 38 are smaller than the motherboard connection terminals 45, and peripheral portions of the motherboard connection terminals 45 are buried in the solder resist film 37. The motherboard connection terminals 45 are mainly formed by a copper layer. Each motherboard connection terminal 45 has a structure in which a plating layer 48 of a material other than copper (specifically, a nickel-gold plating layer) covers only the bottom surface of a portion of the copper layer which portion is the main constituent of the motherboard connection terminal 45.

The thus-configured multilayer wiring substrate 10 is fabricated by, for example, the following procedure.

First, in a build-up step, a support substrate (a glass epoxy substrate or the like) having sufficient strength is prepared. On the support substrate, the resin insulation layers 21 to 24 and the conductive layers 26 are alternately built up, thereby forming the wiring laminate portion 30.

Figure 3:
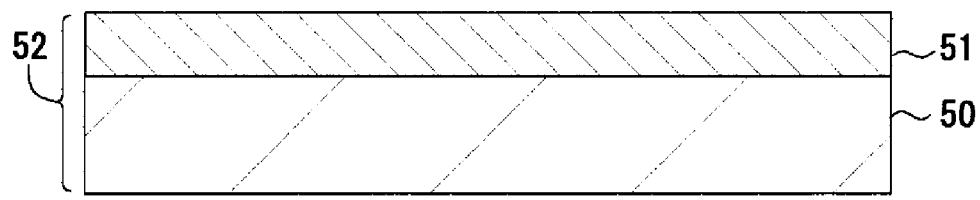
FIG. 3 Explanatory view showing a method of manufacturing the multilayer wiring substrate according to the first embodiment.
Figure 4:
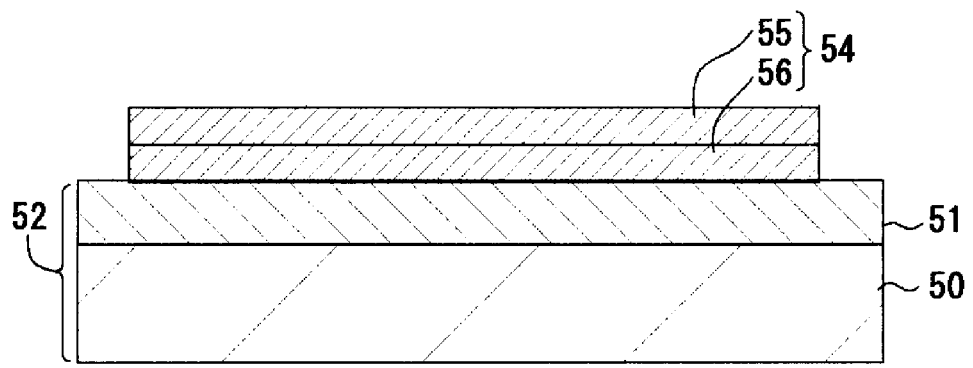
FIG. 4 Explanatory view showing the method of manufacturing the multilayer wiring substrate according to the first embodiment.

More specifically, as shown in FIG. 3, a sheet-like electrically insulative resin base material made of epoxy resin and serving as a ground resin insulation layer 51 is attached onto a support substrate 50, thereby yielding a base material 52 consisting of the support substrate 50 and the ground resin insulation layer 51. Then, as shown in FIG. 4, a metal laminate sheet 54 is disposed on one side of the base material 52 (specifically, on the upper surface of the ground resin insulation layer 51). Through disposition of the metal laminate sheet 54 on the ground resin insulation layer 51, there is ensured such adhesion that, in the subsequent fabrication process, the metal laminate sheet 54 is not separated from the ground resin insulation layer 51. The metal laminate sheet 54 is configured such that two copper foils 55 and 56 (a pair of metal foils) are separably in close contact with each other. Specifically, the copper foils 55 and 56 are laminated together with metal plating (e.g., chromium plating, nickel plating, titanium plating, or composite plating thereof) intervening therebetween, thereby forming the metal laminate sheet 54.

Figure 5:
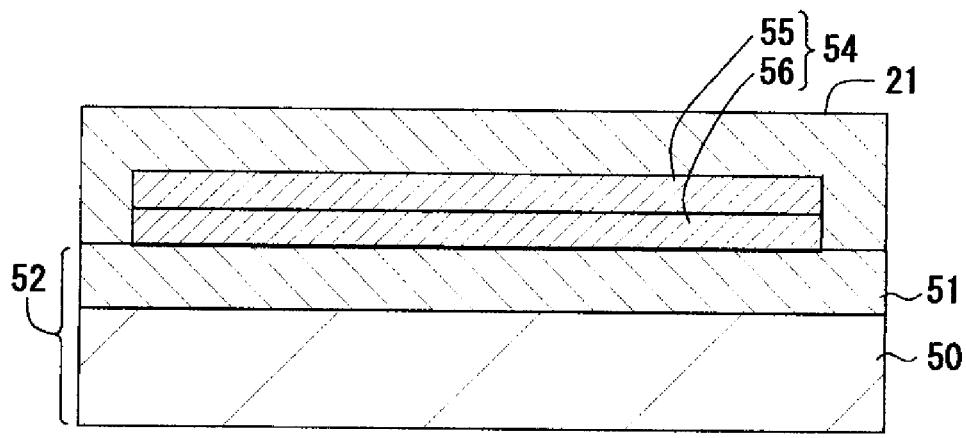
FIG. 5 Explanatory view showing the method of manufacturing the multilayer wiring substrate according to the first embodiment.

Subsequently, as shown in FIG. 5, the sheet-like resin insulation layer 21 is disposed on and attached onto the base material 52 in such a manner as to cover the metal laminate sheet 54. At this time, the resin insulation layer 21 comes into close contact with the metal laminate sheet 54 and comes into close contact with the ground resin insulation layer 51 in a region around the metal laminate sheet 54, thereby sealing in the metal laminate sheet 54.

Figure 6:
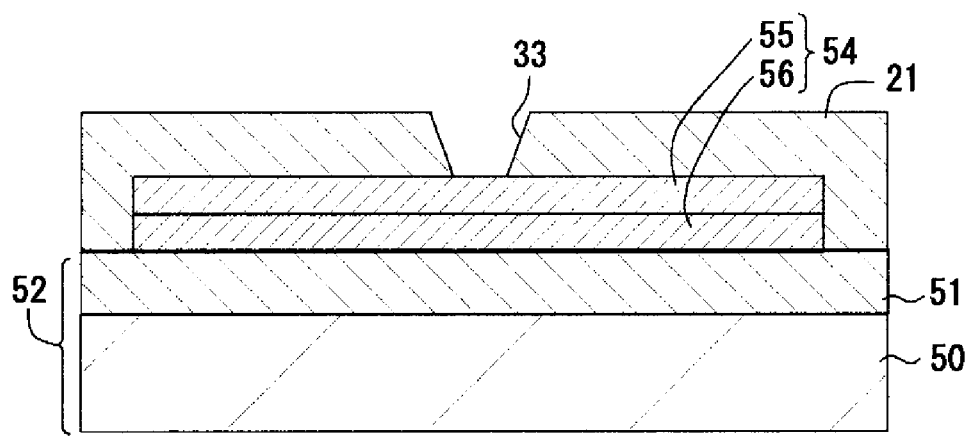
FIG. 6 Explanatory view showing the method of manufacturing the multilayer wiring substrate according to the first embodiment.

Then, as shown in FIG. 6, the via holes 33 are formed in the resin insulation layer 21 at predetermined positions by means of performing laser beam machining by use of, for example, excimer laser, UV laser, or $CO_2$ laser. Next, by use of etchant, such as a potassium permanganate solution, a desmear step is performed for removing smears from inside the via holes 33. In the desmear step, in place of treatment by use of etchant, plasma asking by use of, for example, $O_2$ plasma may be performed.

Figure 7:
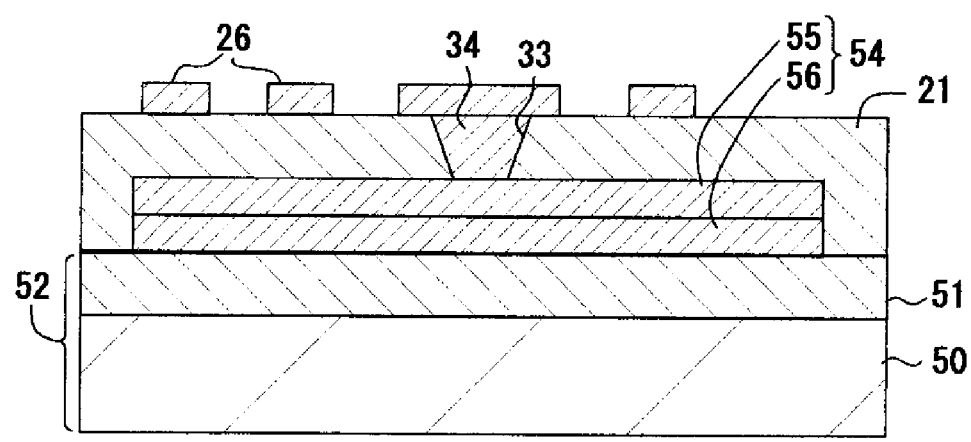
FIG. 7 Explanatory view showing the method of manufacturing the multilayer wiring substrate according to the first embodiment.

After the desmear step, electroless copper plating and copper electroplating are performed by a known process, thereby forming the via conductors 34 in the via holes 33. Further, etching is performed by a known process (e.g., semi-additive process), thereby forming the conductive layer 26 in a predetermined pattern on the resin insulation layer 21 (see FIG. 7).

Also, the second to fourth resin insulation layers 22 to 24 and the corresponding conductive layers 26 are formed in layers on the resin insulation layer 21 by processes similar to those used to form the first resin insulation layer 21 and the associated conductive layer 26. By the above-described steps, there is formed a wiring laminate 60 in which the metal laminate sheet 54, the resin insulation layers 21 to 24, and the conductive layers 26 are laminated on the base material 52 (see FIG. 8). Notably, a portion of the wiring laminate 60 which is located above the metal laminate sheet 54 will become the wiring laminate portion 30 of the multilayer wiring substrate 10. Furthermore, portions of the conductive layer 26 formed between the fourth resin insulation layer 24 and the third resin insulation layer 23 will become the IC-chip connection terminals 41 and the capacitor connection terminals 42.

Figure 9:
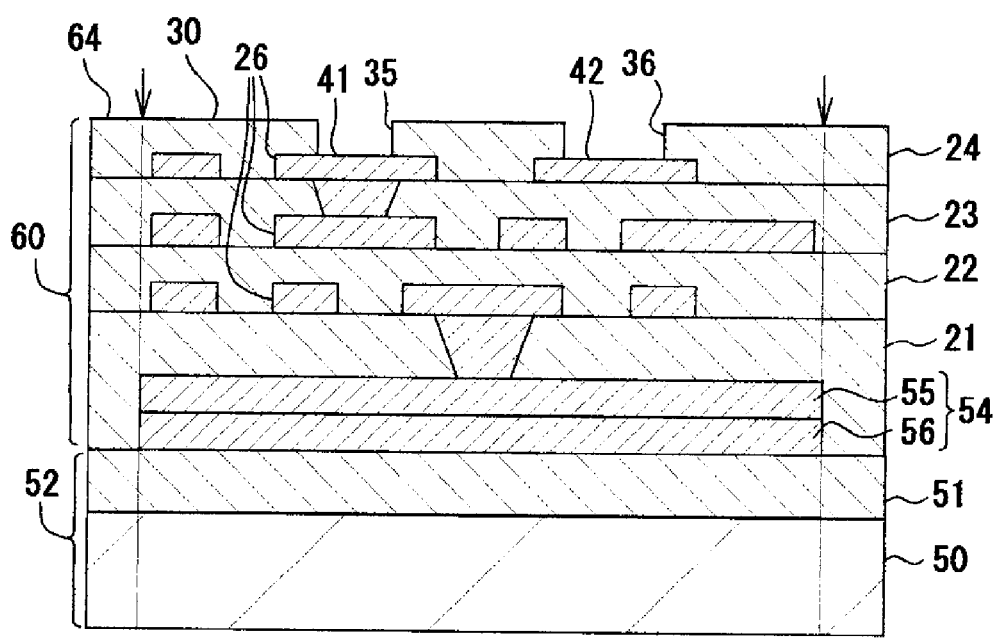
FIG. 9 Explanatory view showing the method of manufacturing the multilayer wiring substrate according to the first embodiment.

Subsequently, as shown in FIG. 9, laser drilling is performed on the outermost resin insulation layer 24, thereby forming a plurality of the openings 35 and 36, to thereby expose the top surfaces of the IC-chip connection terminals 41 and the capacitor connection terminals 42 (drilling step). Next, there is performed a desmear step of removing smears from inside the openings 35 and 36 by use of, for example, a potassium permanganate solution or $O_2$ plasma.

After the desmear step, the wiring laminate 60 is cut by a dicing apparatus (not shown) so as to remove a surrounding portion around the wiring laminate portion 30 (cutting step). At this time, as shown in FIG. 9, cutting progresses along the boundary (indicated by the arrows in FIG. 9) between the wiring laminate portion 30 and a surrounding portion 64 and along the extension of the boundary for further cutting of the base material 52 (the support substrate 50 and the ground resin insulation layer 51) located under the wiring laminate portion 30. As a result of this cutting, a peripheral edge portion of the metal laminate sheet 54 which has been sealed in the resin insulation layer 21 is exposed. That is, as a result of removal of the surrounding portion 64, a bonded portion between the ground resin insulation layer 51 and the resin insulation layer 21 is lost. Consequently, the wiring laminate portion 30 and the base material 52 are connected together merely through the metal laminate sheet 54.

Figure 10:
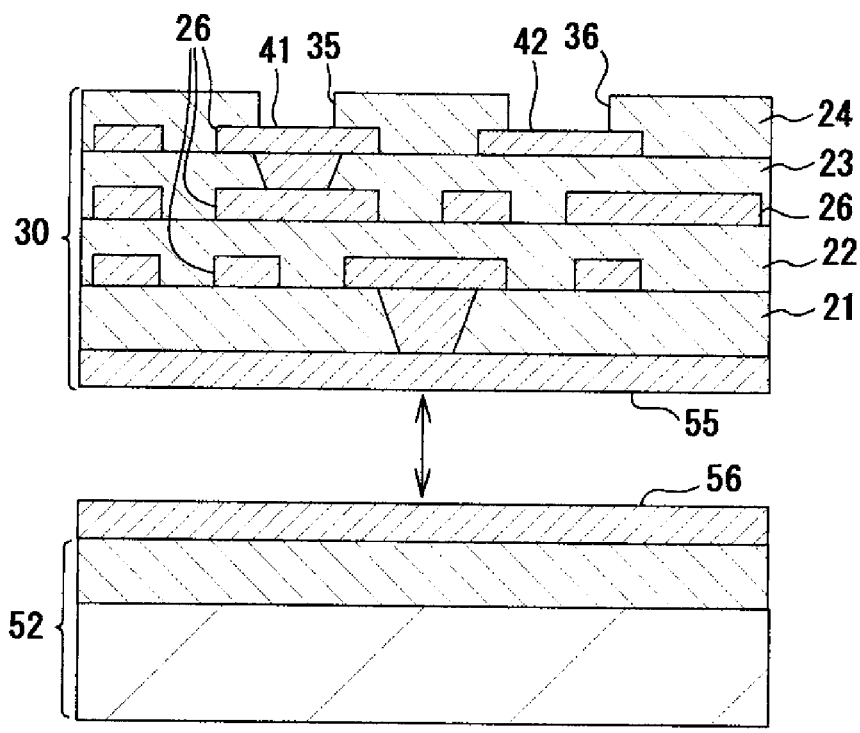
FIG. 10 Explanatory view showing the method of manufacturing the multilayer wiring substrate according to the first embodiment.

As shown in FIG. 10, the wiring laminate portion 30 and the base material 52 are separated from each other at the interface between a pair of the copper foils 55 and 56 of the metal laminate sheet 54, thereby removing the base material 52 from the wiring laminate portion 30 and exposing the copper foil 55 present on the bottom surface of the wiring laminate portion 30 (the resin insulation layer 21) (base-material removing step). Subsequently, the copper foil 55 of the wiring laminate portion 30 is subjected to patterning by a subtractive process (connection-terminal forming step). Specifically, a dry film is laminated on the top surface 31 and the bottom surface 32 of the wiring laminate portion 30. The dry films are subjected to exposure and development, thereby forming an etching resist film on the top surface 31 of the wiring laminate portion 30 so as to cover the entirety of the top surface, and forming an etching resist film on the bottom surface 32 of the wiring laminate portion 30 in a predetermined pattern corresponding to the motherboard connection terminals 45. In this condition, the copper foil 55 of the wiring laminate portion 30 is etched for patterning. As a result, the motherboard connection terminals 45 are formed on the resin insulation layer 21.

Figure 11:
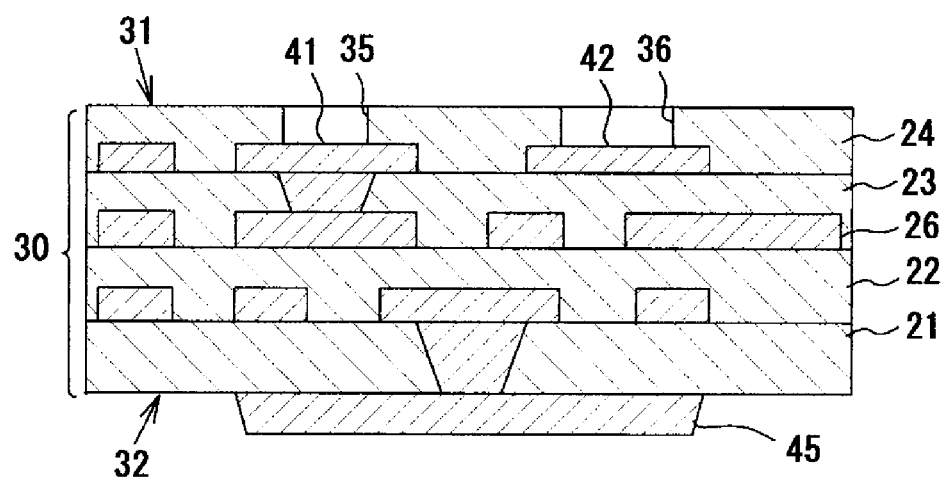
FIG. 11 Explanatory view showing the method of manufacturing the multilayer wiring substrate according to the first embodiment.

Notably, those regions of the copper foil 55 which are not covered by the etching resist film are gradually etched away. That is, the copper foil 55 is gradually etched away from the bottom surface, which is a side toward the etching resist film. Thus, the motherboard connection terminals 45 are formed in such a manner as to have a trapezoidal cross section such that the top surfaces of the motherboard connection terminals 45 are greater in area than the bottom surfaces of the motherboard connection terminals 45. Then, the etching resist films formed on the top surface 31 and the bottom surface 32 of the wiring laminate portion 30 are separated and removed (see FIG. 11).

Figure 12:
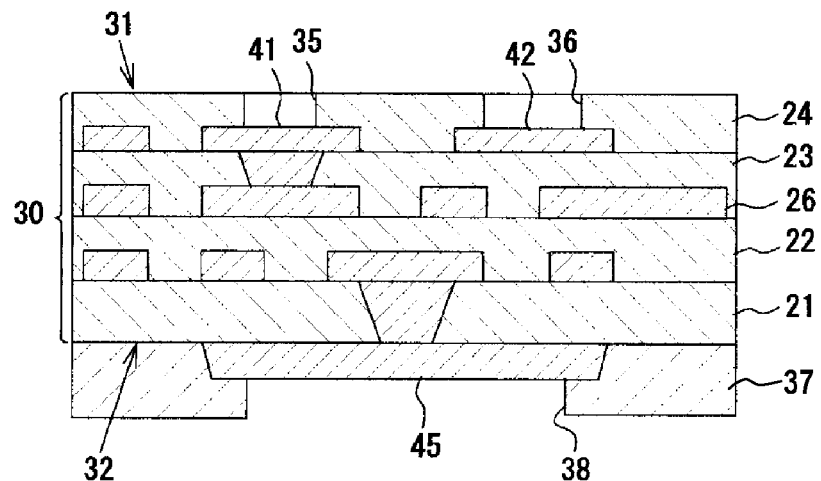
FIG. 12 Explanatory view showing the method of manufacturing the multilayer wiring substrate according to the first embodiment.

Next, a photosensitive epoxy resin is applied onto the resin insulation layer 21 and is cured, whereby the solder resist film 37 is formed. After that, exposure and development are performed in a state in which a predetermined mask is disposed on the solder resist film, whereby openings 38 are formed in the solder resist film 37 in a predetermined pattern (see FIG. 12).

Subsequently, electroless nickel plating and electroless gold plating are sequentially performed on the surfaces (top surfaces) of the IC-chip connection terminals 41 exposed from the openings 35, the surfaces (top surfaces) of the capacitor connection terminals 42 exposed from the openings 36, and the surfaces (bottom surfaces) of the motherboard connection terminals 45 exposed from the openings 38, thereby forming the nickel-gold plating layers 46, 47, and 48

(plating step). By going through the above-mentioned steps, the multilayer wiring substrate 10 of FIG. 1 is manufactured.

Therefore, the present embodiment can yield the following effects.

(1) In the multilayer wiring substrate 10 of the present embodiment, the outermost resin insulation layer 24 is formed of the same thermosetting resin insulation material as the inner resin insulation layers 22 and 23. In this case, a photo lithography process encounters difficulty in formation of the openings 35 and 36 in the outermost resin insulation layer 24. However, through performance of laser drilling, the openings 35 and 36 can be reliably formed in the resin insulation layer 24. Furthermore, since the desmear step is carried out after the build-up step, the surface roughness of the outermost resin insulation layer 24 can be set to an arbitrary level. Accordingly, the surface of the outermost resin insulation layer 24 can have a surface roughness suitable for flux and underfill agent, to thereby enable them to spread over the surface by their wettability when an IC chip or the like is mounted onto the multilayer wiring substrate 10.

(2) In the present embodiment, the step of forming holes through laser drilling is performed before performance of the base-material removing step. In this case, since the wiring laminate portion 30 on the base material 52 has a relatively large strength, it can be maintained in a warpage-free state. Therefore, the openings 35 and 36 can be formed on the surface of the outermost resin insulation layer 24 of the wiring laminate portion 30 at accurate positions corresponding to the connection terminals 41 and 42.

(3) In the present embodiment, two types of connection terminals; i.e., the IC-chip connection terminals 41, to which an IC chip is to be connected, and the capacitor connection terminals 42, to which a chip capacitor is to be connected, are present on the top surface 31 of the multilayer wiring substrate 10; and these connection terminals 41 and 42 are disposed within the plurality of openings 35 and 36. These connection terminals 41 and 42 are formed such that their top surfaces are lower in height than the surface of the outermost resin insulation layer 24, and their peripheral portions are buried in the outermost resin insulation layer 24. Therefore, the outermost resin insulation layer 24 functions as a solder resist film, to thereby enable solder bumps and solder filets to be reliably formed on the top surfaces of the connection terminals 41 and 42. In the case of the multilayer wiring substrate 10, since the inter-terminal distance of the IC-chip connection terminals 41 is small, if solder bumps bulge from the side surfaces of the IC-chip connection terminals 41, a short-circuit may be formed between the terminals. In contrast, in the present embodiment, since solder bumps are formed only on the top surfaces of the IC-chip connection terminals 41, solder bumps do not bulge laterally, whereby formation of a short-circuit between the terminals can be avoided. Moreover, since the outermost resin insulation layer 24 is formed of a build-up material which is the same as that used to form the inner resin insulation layers 22 and 23 and which is excellent in electrical insulation performance, the intervals of the IC-chip connection terminals 41 can be narrowed, whereby the degree of integration of the multilayer wiring substrate 10 can be increased.

Second Embodiment

Next, a second embodiment of the present invention will be described with reference to the drawings. The present embodiment differs from the first embodiment in the method of manufacturing the multilayer wiring substrate 10.

Figure 8:
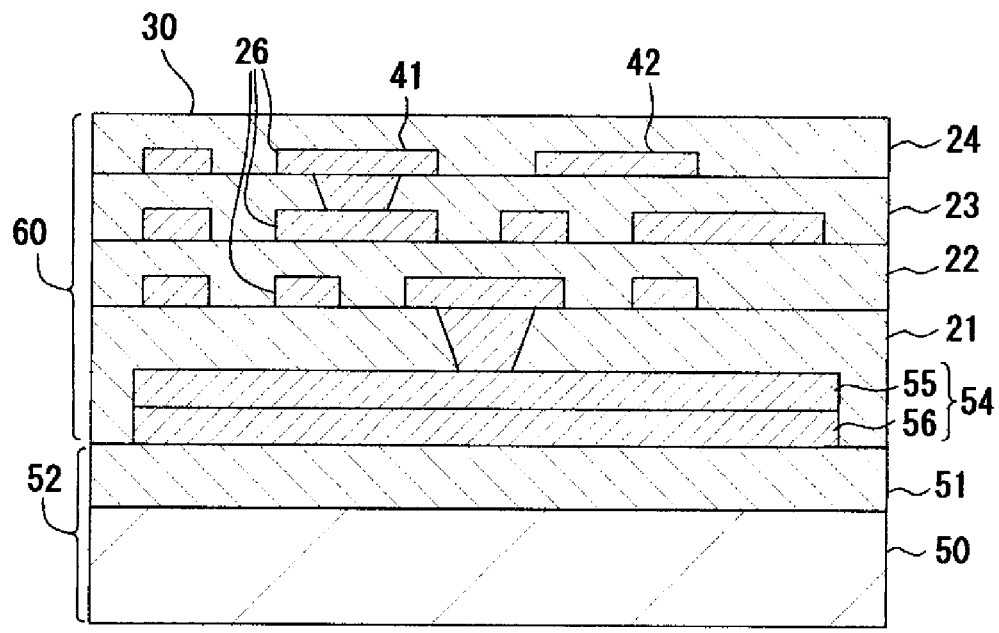
FIG. 8 Explanatory view showing the method of manufacturing the multilayer wiring substrate according to the first embodiment.

In the present embodiment as well, as in the first embodiment, a build-up step is first performed so as to form the wiring laminate 60 in which the metal laminate sheet 54, the resin insulation layers 21 to 24, and the conductive layers 26 are laminated on the base material 52 (see FIG. 8).

Figure 13:
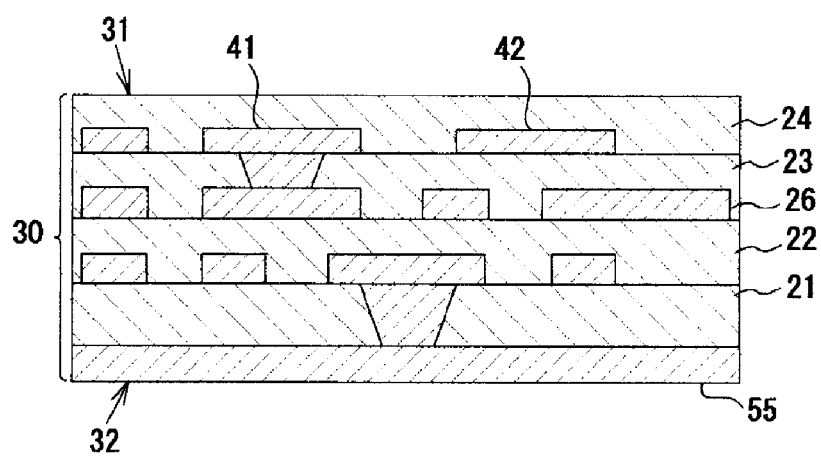
FIG. 13 Explanatory view showing a method of manufacturing a multilayer wiring substrate according to a second embodiment.

After that, the wiring laminate 60 is cut by a dicing apparatus (not shown) so as to remove a surrounding portion around the wiring laminate portion 30 (cutting step). Subsequently, as shown in FIG. 13, the wiring laminate portion 30 and the base material 52 are separated from each other at the interface between the copper foils 55 and 56 of the metal laminate sheet 54, thereby removing the base material 52 from the wiring laminate portion 30 and exposing the copper foil 55 present on the bottom surface of the wiring laminate portion 30 (the resin insulation layer 21) (base-material removing step).

Figure 14:
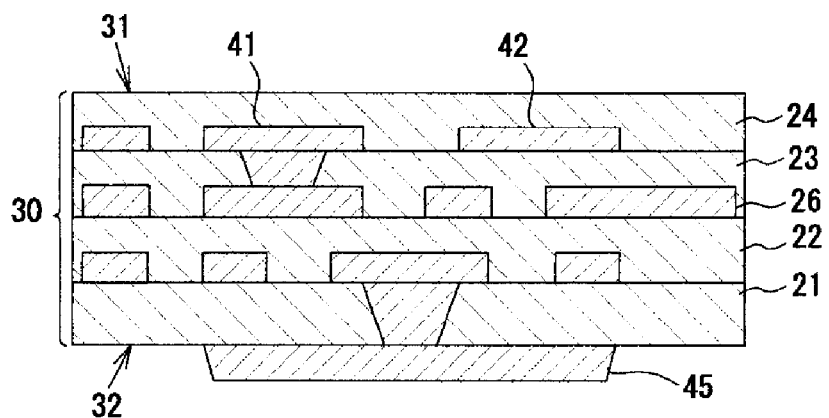
FIG. 14 Explanatory view showing the method of manufacturing the multilayer wiring substrate according to the second embodiment.

After completion of the base-material removing step, the copper foil 55 of the wiring laminate portion 30 is subjected to patterning by a subtractive process (connection-terminal forming step). Specifically, a dry film is laminated on the bottom surface 32 of the wiring laminate portion 30. The dry film is subjected to exposure and development, thereby forming an etching resist film on the bottom surface 32 of the wiring laminate portion 30 in a predetermined pattern corresponding to the motherboard connection terminals 45. In this condition, the copper foil 55 of the wiring laminate portion 30 is etched for patterning. As a result, the motherboard connection terminals 45 are formed on the resin insulation layer 21. Then, the etching resist film formed on the bottom surface 32 of the wiring laminate portion 30 are separated and removed (see FIG. 14).

Figure 15:
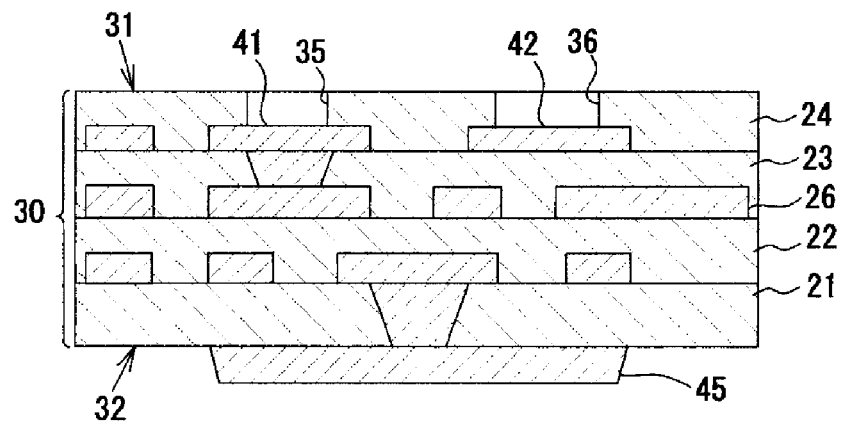
FIG. 15 Explanatory view showing the method of manufacturing the multilayer wiring substrate according to the second embodiment.

Subsequently, as shown in FIG. 15, laser drilling is performed on the outermost resin insulation layer 24, thereby forming a plurality of the openings 35 and 36, to thereby expose the top surfaces of the IC-chip connection terminals 41 and the capacitor connection terminals 42 (drilling step). Next, there is performed a desmear step of removing smears from inside the openings 35 and 36 by use of, for example, a potassium permanganate solution or $O_2$ plasma.

Next, a photosensitive epoxy resin is applied onto the resin insulation layer 21 and is cured, whereby the solder resist film 37 is formed. After that, exposure and development are performed in a state in which a predetermined mask is disposed on the solder resist film, whereby openings 38 are formed in the solder resist film 37 in a predetermined pattern (see FIG. 12).

Subsequently, electroless nickel plating and electroless gold plating are sequentially performed on the surfaces of the IC-chip connection terminals 41 exposed from the openings 35, the surfaces of the capacitor connection terminals 42 exposed from the openings 36, and the surfaces of the motherboard connection terminals 45 exposed from the openings 38, thereby forming the nickel-gold plating layers 46, 47, and 48 (plating step). By going through the above-mentioned steps, the multilayer wiring substrate 10 of FIG. 1 is manufactured.

As described above, in the present embodiment, in the connection-terminal forming step, the outermost resin insulation layer 24 on the top surface 31 side of the wiring laminate portion 30 is covered with the resin insulation layer 24; and the openings 35 and 36 are not provided in the resin insulation layer 24. Since the resin insulation layer 24 functions as an etching resist film, formation of an etching resist film on the top surface 31 side becomes unnecessary, and the motherboard connection terminals 45 can be formed in a predetermined pattern in a state in which an etching resist film is provided on the bottom surface 32 only.

Notably, the embodiments of the present invention may be modified as follows.

Figure 16:
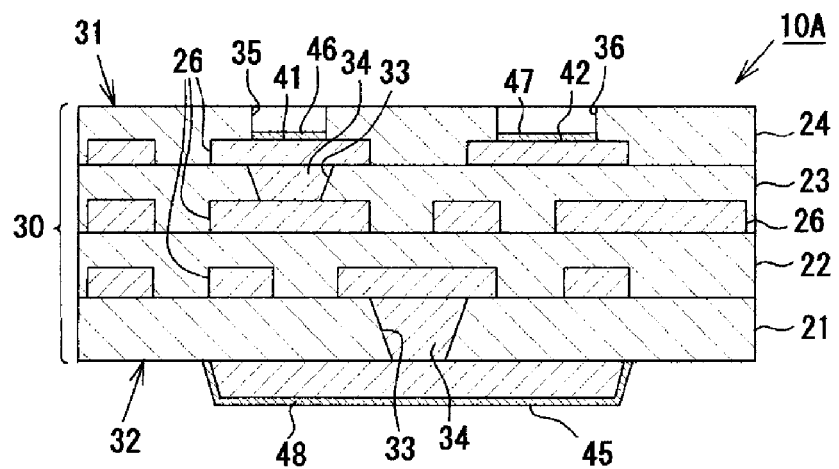
FIG. 16 Sectional view schematically showing the structure of a multilayer wiring substrate according to another embodiment.
Figure 17:
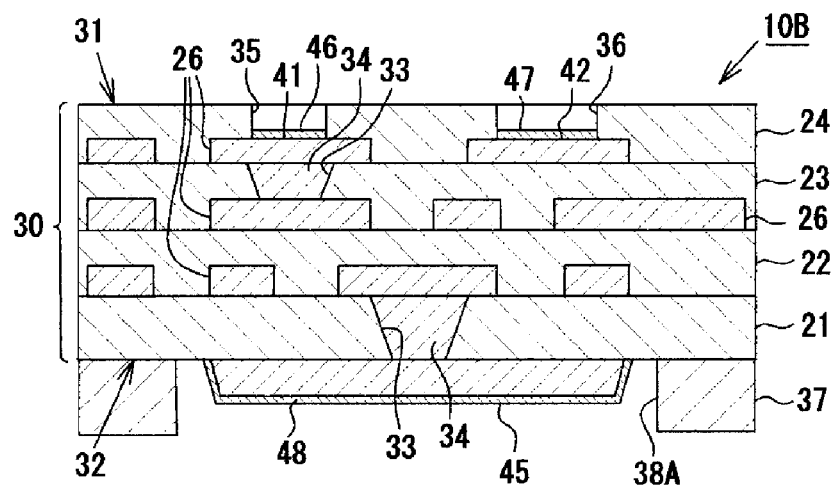
FIG. 17 Sectional view schematically showing the structure of a multilayer wiring substrate according to another embodiment.

In the multilayer wiring substrates 10 according to the embodiments, the solder resist film 37 is formed on the bottom surface 32 of the wiring laminate portion 30. However, as in a multilayer wiring substrate 10A shown in FIG. 16, the solder resist film 37 may be omitted. Furthermore, the multilayer wiring substrates 10 are configured such that the openings 38 formed in the solder resist film 37 is smaller than the motherboard connection terminals 45, and peripheral portions of the motherboard connection terminals 45 are buried in the solder resist film 37. However, the structures of the multilayer wiring substrates 10 are not limited thereto. As in a multilayer wiring substrate 10B shown in FIG. 17, the solder resist film 37 may be formed such that openings 38A are larger than the motherboard connection terminals 45, and the entire side surface and the entire bottom surface of each motherboard connection terminal 45 are exposed. Notably, the multilayer wiring substrates 10A and 10B have a structure in which the bottom surface and the side surface of each motherboard connection terminal 45 are covered with a plating layer 48. Accordingly, relatively large solder fillets can be formed on the bottom surfaces and the side surfaces of the motherboard connection terminals 45, whereby a sufficiently large connection strength can be secured between each of the multilayer wiring substrates and a motherboard. Furthermore, in the case of the multilayer wiring substrate 10A, since the solder resist film 37 is not formed, it is possible to avoid warpage of the multilayer wiring substrate 10A, which would otherwise occur due to a difference in coefficient of thermal expansion between the resin insulation layers 21 to 24 and the solder resist film 37.

Figure 18:
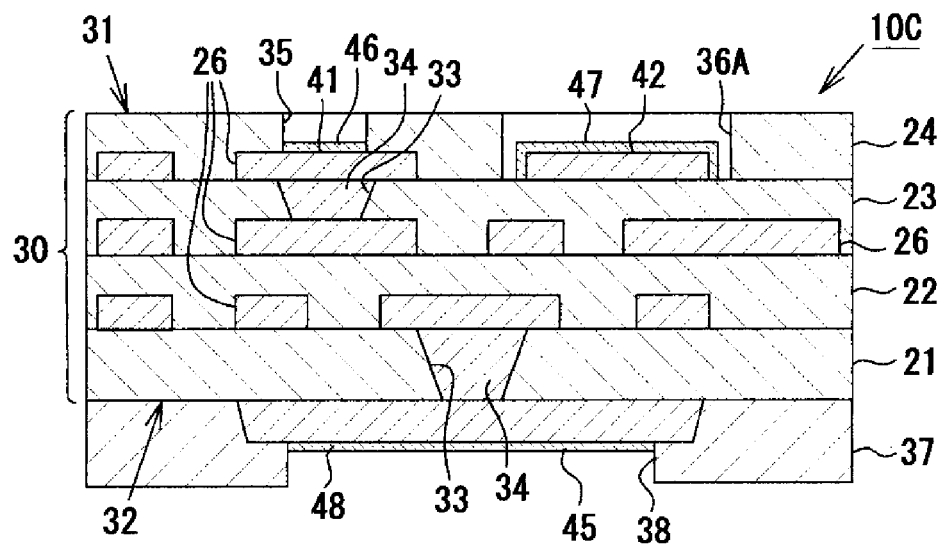
FIG. 18 Sectional view schematically showing the structure of a multilayer wiring substrate according to another embodiment.

In the multilayer wiring substrates 10 of the above-described embodiments, the openings 35 and 36 formed in the outermost resin insulation layer 24 are smaller than the connection terminals 41 and 42, and peripheral portions of the connection terminals 41 and 42 are buried in the resin insulation layer 24. However, the structures of the multilayer wiring substrates 10 are not limited thereto. As in a multilayer wiring substrate 10C shown in FIG. 18, the resin insulation layer 24 may be formed such that openings 36A are larger than the capacitor connection terminals 42, and the entire top surface and the entire side surface of each capacitor connection terminal 42 are exposed. The multilayer wiring substrate 10C has a structure in which the top surface and the side surface of each capacitor connection terminal 42 are covered with the plating layer 47. Accordingly, relatively large solder fillets can be formed on the top surfaces and the side surfaces of the capacitor connection terminals 42, whereby a sufficiently large connection strength can be secured between the multilayer wiring substrate and a chip capacitor.

Figure 19:
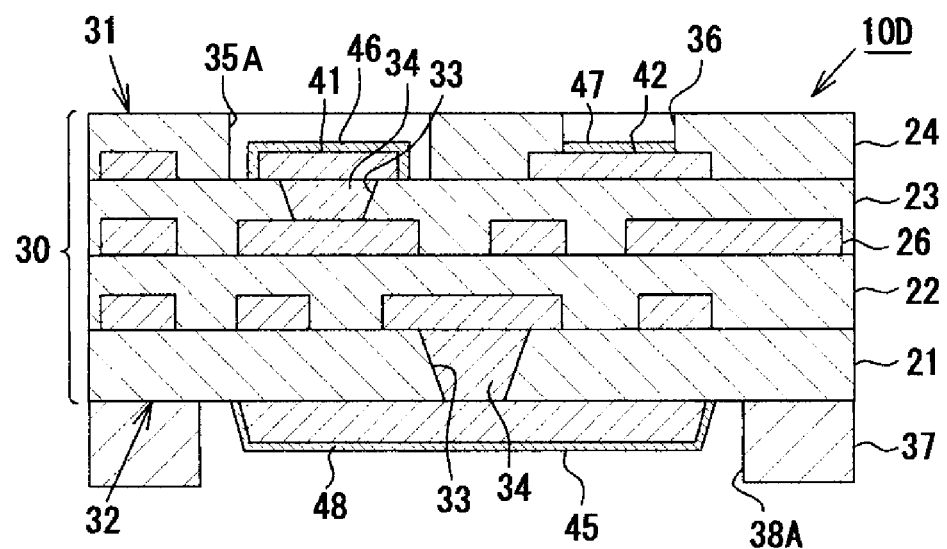
FIG. 19 Sectional view schematically showing the structure of a multilayer wiring substrate according to another embodiment.

Furthermore, as in a multilayer wiring substrate 10D of FIG. 19, the resin insulation layer 24 may be formed such that openings 35A are larger than the IC-chip connection terminals 41, and the entire top surface and the entire side surface of each IC-chip connection terminal 41 are exposed. In the case of this multilayer wiring substrate 10D, relatively large solder fillets can be formed on the top surfaces and the side surfaces of the IC-chip connection terminals 41, whereby a sufficiently large connection strength can be secured between the multilayer wiring substrate and an IC chip.

In the above-described embodiments, in the drilling step, the plurality of openings 35 and 36 are formed in the outermost resin insulation layer 24 so as to expose the IC-chip connection terminals 41 and the capacitor connection terminals 42. However, their structures are not limited thereto. For examples, in the drilling step, in addition to the connection terminals 41 and 42, other portions (e.g., a portion forming an alignment mark) of the corresponding conductive layer 26, other than the connection terminals may be exposed. Moreover, other portions of the conductive layer 26 may be exposed so as to form a serial number, a direction identification mark, etc. in addition to the alignment mark.

In the above-described embodiments, the desmear step is performed immediately after the drilling step. However, the embodiments may be modified such that the desmear step is performed after formation of the solder resist film 37.

The above-described embodiments are configured such that the plurality of conductive layers 26 formed in the plurality of resin insulation layers 21 to 24 are connected with one anther through the via conductors 34 whose diameters increase in a direction from the bottom surface 32 to the top surface 31. However, their structures are not limited thereto. The via conductors 34 formed in the plurality of resin insulation layers 21 to 24 may have any shape so long as their diameters increase in the same direction; and the plurality of conductive layers 26 may be connected with one anther through via conductors whose diameters increase in a direction from the top surface 31 to the bottom surface 32.

In the above-described embodiment, each of the plating layers 46, 47, and 48, which cover the connection terminals 41, 42, and 45, respectively, is a nickel-gold plating layer. However, the nickel-gold plating layer can be replaced with any other plating layer, such as nickel-palladium-gold plating layer, so long as the plating layer is formed of a material other than copper.

Next, a technical idea that the embodiments described above implement is enumerated below.

(1) A method of manufacturing a multilayer wiring substrate has a laminate structure in which a plurality of resin insulation layers made primarily of the same resin insulation material, and a plurality of conductive layers are laminated alternately in multilayer arrangement. A plurality of first-main-surface-side connection terminals are disposed on a first main surface of the laminate structure. A plurality of second-main-surface-side connection terminals are disposed on a second main surface of the laminate structure. The plurality of conductive layers are formed in the plurality of resin insulation layers and interconnected by means of via conductors whose diameters increase toward the first main surface or the second main surface. The method includes a build-up step of alternately laminating the plurality of resin insulation layers and the plurality of conductive layers in multilayer arrangement on a side of a base material where a pair of metal foils are separably laminated, thereby forming a laminate structure; a drilling step of forming a plurality of openings in the outermost resin insulation layer through laser drilling so as to expose the first-main-surface-side connection terminals; a base-material removing step of, after the build-up step, removing the base material and exposing the metal foil by separating the pair of metal foils from each other; and a desmear step of, after the drilling step, removing smears from inside the openings.

DESCRIPTION OF REFERENCE NUMERALS 10, 10A to 10D: multilayer wiring substrate
21 to 24: resin insulation layer
26: conductive layer
30: wiring laminate portion serving as laminate structure
31: top surface serving as first main surface
32: bottom surface serving as second main surface
33: via conductors
35, 36: opening 41: IC-chip connection terminal
42: capacitor connection terminal serving as passive-component connection terminal
45: motherboard connection terminal serving as second-main-surface-side connection terminal
46, 47: plating layer
52: base material
55: copper foil serving as metal foil

What is claimed is:

1. A method of manufacturing a multilayer wiring substrate having a laminate structure in which a plurality of resin insulation layers, and a plurality of conductive layers are laminated alternately in multilayer arrangement, a plurality of first-main-surface-side connection terminals being disposed on one side of the laminate structure where a first main surface thereof is present, a plurality of second-main-surface-side connection terminals being disposed on an other side of the laminate structure where a second main surface thereof is present, the plurality of conductive layers being formed in the plurality of resin insulation layers and interconnected by means of via conductors whose diameters increase toward the first main surface or the second main surface, the method comprising:

a build-up step that includes:
    a step of separably laminating a metal foil on a side of a base material, and
    a step of forming a laminate structure that includes alternately laminating the plurality of resin insulation layers made primarily of the same resin insulation material and the plurality of conductive layers in multilayer arrangement on the metal foil separably laminated on the side of the base material;

a drilling step of forming a plurality of openings in an outermost resin insulation layer of the laminate structure through laser drilling so as to expose the first-main-surface-side connection terminals of the multilayer wiring substrate;

a desmear step of, after the drilling step, removing smears from inside the openings in the outermost resin insulation layer of the laminate structure; and a base-material removing step of, after the build-up step, removing the base material and exposing the metal foil.

2. The method of manufacturing a multilayer wiring substrate according to claim 1, wherein the outermost resin insulation layer is formed of a build-up material mainly formed of a hardened resin insulation material that is not photocurable.

3. The method of manufacturing a multilayer wiring substrate according to claim 1, wherein the drilling step is performed before the base-material removing step, further comprising:

a connection-terminal forming step of, after the base-material removing step, forming the second-main-surface-side connection terminals in a state in which etching resist films cover an entirety of the first main surface and the metal foil in a predetermined pattern corresponding to the second-main-surface-side connection terminals, and subsequently etching the metal foil to form the second-main-surface-side connection terminals; and a resist removing step of removing the etching resist films to thereby expose the first-main-surface-side connection terminals and the second-main-surface-side connection terminals.

4. The method of manufacturing a multilayer wiring substrate according to claim 1, further comprising:

a connection-terminal forming step of, after the base-material removing step, forming the second-main-surface-side connection terminals by patterning the metal foil by a subtractive method in a state in which an etching resist film is provided on the second main surface;

wherein the drilling step is performed after the connection-terminal forming step.

5. The method of manufacturing a multilayer wiring substrate according to claim 1, wherein the drilling step exposes the first-main-surface-side connection terminals and a portion of one of the plurality of conductive layers other than the first-main-surface-side connection terminals.

6. The method of manufacturing a multilayer wiring substrate according to claim 1, wherein the base-material removing step is performed after the drilling step and after the desmear step.

* * * * *